United States Patent [19]
Sawada

[11] Patent Number: 6,156,595
[45] Date of Patent: Dec. 5, 2000

[54] METHOD OF FABRICATING A BI-CMOS IC DEVICE INCLUDING A SELF-ALIGNMENT BIPOLAR TRANSISTOR CAPABLE OF HIGH SPEED OPERATION

[76] Inventor: Shigeki Sawada, 5-1-13-8-303, Kabutodai, Kizu-cho, Soraku-gun, Kyoto, Japan

[21] Appl. No.: 09/168,518

[22] Filed: Oct. 8, 1998

[30] Foreign Application Priority Data

Oct. 8, 1997 [JP] Japan ..................................... 9-275670

[51] Int. Cl.⁷ .............................................. H01L 21/8238
[52] U.S. Cl. ......................... 438/202; 438/309; 438/207; 438/234; 438/366
[58] Field of Search ........................... 438/202, 205–207, 438/234, 309, 218, 703, 366, 367; 257/370, 378

[56] References Cited

U.S. PATENT DOCUMENTS

| | | | |
|---|---|---|---|
| 4,960,726 | 10/1990 | Lechaton et al. | 438/234 |
| 5,037,768 | 8/1991 | Cosentino | 438/366 |
| 5,100,811 | 3/1992 | Winnerl et al. | 438/202 |
| 5,124,271 | 6/1992 | Havemann | 438/703 |
| 5,354,699 | 10/1994 | Ikeda et al. | 438/234 |
| 5,824,560 | 10/1998 | Van Der Wel et al. | 438/234 |

FOREIGN PATENT DOCUMENTS 63-281456  11/1988  Japan .

*Primary Examiner*—Olik Chaudhuri
*Assistant Examiner*—Hoai Pham
*Attorney, Agent, or Firm*—Snell & Wilmer, L.L.P.

[57] ABSTRACT

A method for producing a bipolar transistor and an MOS transistor of the present invention includes the steps of: forming a first insulation film in an MOS transistor region where the MOS transistor is to be formed and in a bipolar transistor region where the bipolar transistor is to be formed; forming a first conductive film and a second insulation film on the first insulation film; and removing the second insulation film, the first conductive film and the first insulation film from the bipolar transistor region.

4 Claims, 11 Drawing Sheets

METHOD OF FABRICATING A BI-CMOS IC DEVICE INCLUDING A SELF-ALIGNMENT BIPOLAR TRANSISTOR CAPABLE OF HIGH SPEED OPERATION

BACKGROUND OF THE INVENTION

1. Field of the Invention

The present invention relates to a Bi-CMOS IC (integrated circuit) device including a self-alignment bipolar transistor capable of very high speed operation and a CMOS transistor provided on a common semiconductor substrate, and a method for producing the same.

2. Description of the Related Art

As mobile communication apparatuses such as cellular telephones have been developed dramatically in recent years, it has been necessary to integrate a high frequency circuit and a highly-integrated logic circuit into a single semiconductor IC. Accordingly, there has been a growing demand for a technique of providing a very high speed self-aligned bipolar transistor (which is suitable for a high speed ECL circuit or a high frequency analog circuit) and a highly-integrated, low power consumption CMOS transistor together on the same semiconductor substrate.

Japanese Laid-open Publication No. 63-281456 discloses a method for producing a Bi-CMOS IC device in which a double-layer polycrystalline silicon self-aligned bipolar transistor (where an emitter lead electrode is self-aligned with a base lead electrode) and a CMOS transistor are provided on the same semiconductor substrate.

Referring to FIGS. 14 to 25, a method for producing a conventional Bi-CMOS IC device will be described. The conventional Bi-CMOS IC device includes NPN bipolar transistor and an N-type MOS transistor integrated on a P-type semiconductor substrate 301.

FIG. 14 illustrates a substrate 20 which includes a P-type silicon semiconductor substrate 301. An N-type buried collector layer 302 is provided on the P-type semiconductor substrate 301. An N-type epitaxial layer (not shown) is provided on the entire surface of the P-type semiconductor substrate 301. An N-type collector layer 303 is provided on the N-type epitaxial layer. A P-type layer 304 of the bipolar transistor for device separation is provided on the N-type epitaxial layer. A P-type well layer 305 of the N-type MOS transistor is provided on the N-type epitaxial layer. The substrate 20 further includes silicon oxide device isolation LOCOS (Local Oxidation of Silicon) films 306a to 306d.

Referring to FIGS. 15 to 19, the substrate 20 illustrated in FIG. 14 is formed as follows.

FIG. 15 illustrates a substrate 20a being subjected to arsenic (As) ion implantation. A resist 350 is first applied on the entire surface of the P-type semiconductor substrate 301 and patterned in a predetermined pattern by a suitable photolithography technique. Then, using the resist 350 as a mask, arsenic ions are implanted into the substrate 20a. The resist 350 is removed after the ion implantation process.

FIG. 16 illustrates a substrate 20b in which the N-type buried collector layer 302 of the NPN bipolar transistor has been formed. The N-type buried collector 302 is formed through a heat treatment at about 1100° C.

Then, an N-type epitaxial layer 351 is grown on the P-type semiconductor substrate 301 illustrated in FIG. 16. A resist is applied on the entire surface of the N-type epitaxial layer 351 and patterned in a predetermined pattern by a photolithography technique. Then, using the resist as a mask, phosphorus (P) ions are implanted into the N-type epitaxial layer 351 so as to form the N-type collector layer 303 (FIG. 18). The resist is removed after the ion implantation process.

FIG. 17 illustrates a substrate 20c being subjected to boron (B) ion implantation, in which the N-type epitaxial layer 351 and another resist 350' have been formed. The resist 350' is applied on the entire surface of the N-type epitaxial layer 351 and patterned in a predetermined pattern by a photolithography technique. Then, using the resist 350' as a mask, boron ions are implanted into the N-type epitaxial layer 351 so as to form the P-type layer 304 and the P-type well layer 305. The resist 350' is removed after the ion implantation process, and a heat treatment at about 1100° C. is performed, thereby forming the N-type collector layer 303 and the P-type layer 304 of the NPN bipolar transistor, and the P-type well layer 305 of the N-type MOS transistor. FIG. 18 illustrates a substrate 20d in which the NPN bipolar transistor has been formed.

Thereafter, a protective oxide film (not shown) and a silicon nitride film (not shown) are grown on the N-type epitaxial layer 351 (the N-type collector layer 303, the P-type layer 304 and P-type well layer 305). Then, a resist is applied on the entire surface of the silicon nitride film patterned in a predetermined pattern by a photolithography technique. Using the resist as a mask, the silicon nitride film is partially etch away and thus patterned. The resist is then removed. Using the patterned silicon nitride film as a mask, the N-type epitaxial layer 351 (the N-type collector layer 303, the P-type layer 304 and P-type well layer 305) is oxidized at about 1000° C. so as to form the device isolation LOCOS films 306a to 306d. After the LOCOS films 306a to 306d are formed, the silicon nitride film and the protective oxide film are removed. FIG. 19 illustrates a substrate 20e in which the device isolation LOCOS films 306a to 306d have been formed.

FIG. 20 illustrates a substrate 30. A gate oxide film 307 is provided on a surface of an N-type epitaxial layer (not shown). A bipolar transistor region 308a is a region where the bipolar transistor is to be formed. An MOS transistor region 308b is a region where the MOS transistor is to be formed. A base lead electrode 309 of the NPN transistor is made of a polycrystalline silicon film. A gate electrode 310 of the N-type MOS transistor is made of a polycrystalline silicon film. An insulation film 311 is provided on the base lead electrode 309. Another insulation film 312 is provided on the gate electrode 310. The substrate 30 also includes an intrinsic base layer 313a of the NPN transistor and an LDD (Lightly Doped Drain) layer 313b of the N-type MOS transistor.

Referring to FIGS. 21 to 25, the substrate 30 illustrated in FIG. 20 is formed as follows.

FIG. 21 illustrates a substrate 30a in which a portion of the gate oxide film 307 corresponding to the bipolar transistor region 308a has been removed. First, the surface of the N-type epitaxial layer 351 (the N-type collector layer 303, the P-type layer 304 and P-type well layer 305) is oxidized at about 900° C., thereby forming the gate oxide film 307 on the entire surface of the N-type epitaxial layer 351. Then, a resist 352 is applied on the entire surface of the gate oxide film 307 and patterned in a predetermined pattern by a photolithography technique so as to have a window (opening) in a region of the resist 352 corresponding to the bipolar transistor region 308a. Using the resist 352 as a mask, a portion of the gate oxide film 307 corresponding to the bipolar transistor region 308a is etched away. The resist 352 is then removed.

FIG. 22 illustrates a substrate 30b in which a polycrystalline silicon film 354 and an insulation film 353 have been formed. First, the polycrystalline silicon film 354 is grown on the entire surface of the substrate 30a from which the resist 352 has been removed. Then, a resist is applied on the polycrystalline silicon film 354 and patterned in a predetermined pattern by a photolithography technique so as to have a window in the bipolar transistor region 308a. Using the resist as a mask, the polycrystalline silicon film 354 is subjected to boron ion implantation, thereby introducing a P-type impurity into the bipolar transistor region 308a. The resist is then removed.

Another resist is applied on the polycrystalline silicon film 354 and patterned in a predetermined pattern by a photolithography technique so as to have a window in the MOS transistor region 308b. Using the resist as a mask, the polycrystalline silicon film 354 is subjected to phosphorus ion implantation, thereby introducing a P-type impurity into the bipolar transistor region 308a. The resist is then removed, and the insulation film 353 is grown on the polycrystalline silicon film 354.

FIG. 23 illustrates a substrate 30c in which the base lead electrode 309, the insulation film 311, the gate electrode 310 and the insulation film 312 have been formed. First, a resist is applied on the insulation film 353 and patterned by a photolithography technique. Then, using the resist as a mask, the insulation film 353 and the polycrystalline silicon film 354 are partially etched away so as to form the base lead electrode 309, the insulation film 311, the gate electrode 310 and the insulation film 312. The resist is then removed.

FIG. 24 illustrates a substrate 30d being subjected to boron ion implantation. First, a resist 355 is applied on the substrate 30d and patterned in a predetermined pattern by a photolithography technique so as to have a window opened in a predetermined region (see FIG. 24). Then, boron ions are implanted into the substrate 30d using the resist 355 and the insulation film 312 as masks so as to form the intrinsic base layer 313a. The resist 355 is removed after the ion implantation process.

FIG. 25 illustrates a substrate 30e being subjected to phosphorus ion implantation. First, a resist 356 is applied on the substrate 30e and patterned in a predetermined pattern by a photolithography technique so as to have a window in a predetermined region (see FIG. 25). Then, phosphorus ions are implanted into the substrate 30e using the resist 356 and the insulation film 311 as masks so as to form the LDD layer 313b. After the LDD layer 313b is formed, the resist 356 is removed.

FIG. 26 illustrates a substrate 30f including a side wall 314a provided on one side surface of each base lead electrode 309 which is closer to an emitter region (a region where an emitter is to be formed), another side wall 314b provided on the other side surface of each base lead electrode 309 which is farther away from the emitter region, another side wall 314c provided on each side surface of the gate electrode 310, and an emitter electrode extraction opening 315 which is defined between the side walls 314a. The substrate 30f is formed as follows.

After the resist 356 is removed from the substrate 30e (FIG. 25), an insulation film is grown on the entire surface of the substrate from which the resist 356 has been removed. Then, an anisotropic etching is performed so as to form the side walls 314a and 314b on the respective side surfaces of each base lead electrode 309, and the side wall 314c on each side surface of the gate electrode 310.

FIG. 27 illustrates a substrate 30g including an emitter electrode 316 of the NPN transistor which is made of a polycrystalline silicon film, a collector electrode 317 of the NPN transistor which is made of the polycrystalline silicon film, an emitter layer 318, a collector contact layer 319, an external base layer 320, and a source-drain layer 321 of the N-type MOS transistor. The substrate 30g illustrated in FIG. 27 is formed as follows.

First, a polycrystalline silicon film is grown on the entire surface of the substrate 30f illustrated in FIG. 26, and is subjected to arsenic ion implantation. A resist is applied on the polycrystalline silicon film and patterned in a predetermined pattern by a photolithography technique. Using the resist as a mask, the polycrystalline silicon film is partially etched away so as to form the emitter electrode 316 and the collector electrode 317. The resist is then removed.

Thereafter, heat treatment at about 900° C. is performed, so that arsenic impurities in the emitter electrode 316 and the collector electrode 317 and boron impurities in the base lead electrode 309 are introduced into the substrate, thereby forming the emitter layer 318, the collector contact layer 319 and the external base layer 320.

Another resist is applied on the surface of the substrate 30g in which the emitter layer 318, the collector contact layer 319 and the external base layer 320 have been formed. The resist is patterned in a predetermined pattern by a photolithography technique. Using the resist, the insulation film 312 and the side walls 314c as masks, the substrate 30g is subjected to arsenic ion implantation so as to form the source-drain layer 321. The resist is removed after the ion implantation process.

Through the above-described process, the base lead electrode 309 and the side walls 314a of the NPN transistor are formed at the same time as the gate electrode 310 and the side walls 314c of the MOS transistor. The emitter electrode extraction opening 315 and the emitter layer 318 are formed in a self-alignment manner with respect to the base lead electrode 309, and the source-drain layer 321 is formed in a self-alignment manner with respect to the gate electrode 310 and the LDD layer 313b. Thus, an LDD structure is obtained in the MOS transistor which improves a hot carrier resistance against hot carriers which may deteriorate the device characteristics. In the bipolar transistor, a base resistance is reduced, as well as a parasitic device component such as a base-collector capacitance or an emitter-base junction capacitance, thereby improving the high frequency characteristics of the device.

The demand for reducing the size of the CMOS IC device while improving the performance thereof is further growing. In fact, a gate oxide film whose thickness is less than 5 nm has been developed.

In the conventional Bi-CMOS IC device and the method for producing the same, a photolithography process is performed after the gate oxide film 307 is formed, so as to remove a portion of the gate oxide film 307 in the bipolar transistor region 308a. Thereafter the polycrystalline silicon film is grown from which the gate electrode 310 is formed. This process in the prior art provides for forming the base electrode 309 of the bipolar transistor and the gate electrode 310 of the MOS transistor from the same polycrystalline silicon film.

During this process, however, a resist is formed directly on the gate oxide film 307. Especially when the thickness of the gate oxide film 307 is as small as about 5 nm or less, the resistance (and thus the reliability) of the gate oxide film 307 may be reduced due to contamination from the resist film or damage from the removal of the resist film. Even when the voltage applied to the gate oxide film 307 is as small as about 3 V, it still can reduce the breakdown voltage and/or increase the amount of leak current over time. As a result, the operating life of such a conventional transistor at about 100° C. is typically only several years.

SUMMARY OF THE INVENTION

According to one aspect of this invention, a method for producing a bipolar transistor and an MOS transistor is provided. The method includes the steps of: forming a first insulation film in an MOS transistor region where the MOS transistor is to be formed and in a bipolar transistor region where the bipolar transistor is to be formed; forming a first conductive film and a second insulation film on the first insulation film; and removing the second insulation film, the first conductive film and the first insulation film from the bipolar transistor region.

In one embodiment of the invention, the method further includes the steps of: removing the second insulation film from the MOS transistor region; forming a second conductive film in a region where an emitter electrode of the bipolar transistor is to be formed and on the first conductive film in a region where the second insulation film is removed; and performing an etching process so as to form the emitter electrode from the second conductive film and a gate electrode from the first and second conductive films.

In one embodiment of the invention, the step of removing the second insulation film, the first conductive film and the first insulation film further includes the steps of: performing an etching process so as to remove the second insulation film and the first conductive film; and performing an etching process so as to remove the first insulation film.

In one embodiment of the invention, the first insulation film is a gate insulation film.

According to another aspect of this invention, a method for producing a Bi-CMOS IC device includes the steps of: successively forming a gate insulation film, a first conductive film and a first insulation film on a semiconductor substrate including an MOS transistor region where an MOS transistor is to be formed and a bipolar transistor region where a bipolar transistor is to be formed; removing the first insulation film, the first conductive film and the gate insulation film from the bipolar transistor region; successively growing a second conductive film and a second insulation film over the semiconductor substrate; selectively etching the second insulation film and the second conductive film so as to form a base lead electrode and an insulation film on the base lead electrode; growing a third insulation film on an entire surface of the semiconductor substrate including an emitter region where an emitter is to be formed, the emitter region being surrounded by a side surface of the base lead electrode and the base lead electrode; anisotropically etching the third insulation film so as to leave a side wall on each side surface of the base lead electrode in the emitter region; removing the first insulation film; growing a third conductive film on the entire surface of the semiconductor substrate including an emitter electrode extraction opening defined by the side walls in the emitter region; and selectively etching the third conductive film and the first conductive film outside the bipolar transistor region so as to form an emitter electrode over the emitter electrode extraction opening and a gate electrode of the MOS transistor, the gate electrode including the third conductive film as an upper layer and the first conductive film as a lower layer.

According to still another aspect of this invention, a Bi-CMOS IC device including an MOS transistor and a bipolar transistor provided on a single semiconductor substrate is provided. The MOS transistor includes a gate electrode which is formed in a layered structure including an upper layer and a lower layer. The bipolar transistor includes: a base lead electrode connected to a base layer, the base lead electrode including an insulative side wall on a side surface of the base lead electrode; an emitter electrode extraction opening; an emitter layer which is formed in a self-alignment manner with respect to the emitter electrode extraction opening by a use of the side wall; and an emitter electrode connected to the emitter layer via the emitter electrode extraction opening, the emitter electrode being formed of a conductive film of which the upper layer of the gate electrode is formed.

According to still another aspect of this invention, a semiconductor device is provided, which is produced by a method including the steps of: forming a gate oxide film, a polycrystalline silicon film and a silicon nitride film in an MOS transistor region where an MOS transistor is to be formed and in a bipolar transistor region in which a bipolar transistor is to be formed; forming a resist in the MOS transistor region; and removing the gate oxide film, the polycrystalline silicon film and the silicon nitride film from the bipolar transistor region.

According to still another aspect of this invention, a semiconductor device is provided, which includes: an upper gate electrode layer and a lower gate electrode layer formed in an MOS transistor region where an MOS transistor is to be formed; and an emitter electrode, a collector electrode and a base lead electrode formed in a bipolar transistor region where a bipolar transistor is to be formed. The upper gate electrode layer and the emitter electrode are formed by etching a layer.

In one embodiment of the invention, the collector electrode is formed by etching the layer.

In one embodiment of the invention, the layer is a polycrystalline silicon layer.

In the Bi-CMOS IC device having such a structure, the gate electrode is formed in a structure including the upper gate electrode layer and the lower gate electrode layer. The upper layer is formed of a conductive film of which the emitter electrode is also formed. The lower layer is formed by growing a conductive film on the gate insulation film successively after the gate insulation film is formed. Thus, no photolithography process is performed after the gate insulation film is formed and before the gate electrode is formed thereon. Therefore, an MOS transistor and a bipolar transistor having good high frequency characteristics can be provided on the same semiconductor substrate without deteriorating the reliability of the gate insulation film of the MOS transistor. Moreover, the emitter electrode of the bipolar transistor can be formed in a self-alignment manner with respect to the base lead electrode by the use of the side walls. Thus, it is possible to reduce the collector-base junction capacitance, etc., and to improve high frequency characteristics.

Thus, the emitter electrode opening and the emitter layer can be formed in a self-alignment manner with respect to the base lead electrode, and the source-drain layer can be formed in a self-alignment manner with respect to the gate electrode and the LDD layer. Moreover, the polycrystalline silicon film to be the gate electrode can be formed successively after the gate insulation film is formed. Thus, a first conductive film to be the lower gate electrode layer and a first insulation film can be formed immediately after the gate insulation film is formed on the semiconductor substrate. Then, the first insulation film, the first conductive film and the gate insulation film are removed from the bipolar transistor region. As a result, no photolithography process is performed after the gate insulation film is formed and before the gate electrode is formed thereon, thereby avoiding a resist film being formed directly on the gate insulation film. Thus, it is possible to obtain an IC device including an MOS transistor, which has a highly-reliable gate insulation film and a high hot carrier resistance, and a bipolar transistor, which has good high frequency characteristics.

Thus, a third conductive film and a portion of the first conductive film outside the bipolar transistor region are selectively etched away, thereby forming an emitter electrode over the emitter electrode extraction opening and the gate electrode of the MOS transistor (including the upper layer of the third conductive film and the lower layer of the first conductive film). Therefore, the total thickness of the layered gate electrode can be sufficiently large to prevent an impurity from reaching the channel region under the lower gate electrode layer and thereby deteriorating the transistor characteristics (e.g., when introducing an impurity into the gate electrode, or during an ion implantation process for forming the LDD layer or the source-drain layer). The thickness of the emitter electrode of the bipolar transistor can be sufficiently small to reduce the emitter resistance which may deteriorate the high frequency characteristics.

Thus, the invention described herein makes possible the advantages of (1) providing a Bi-CMOS IC device in which the base electrode and the gate electrode are formed from the same polycrystalline silicon film, while preventing a decrease in the breakdown voltage of the gate insulation film by avoiding a photolithography process immediately after the gate oxide film is formed for removing a portion of the gate oxide film in a bipolar transistor region; and (2) providing a method for producing such a Bi-CMOS IC device.

These and other advantages of the present invention will become apparent to those skilled in the art upon reading and understanding the following detailed description with reference to the accompanying figures.

DESCRIPTION OF THE PREFERRED EMBODIMENTS

A Bi-CMOS IC device according to an example of the present invention and a method for producing the same will now be described with reference to FIGS. 1 to 13.

Figure 1:
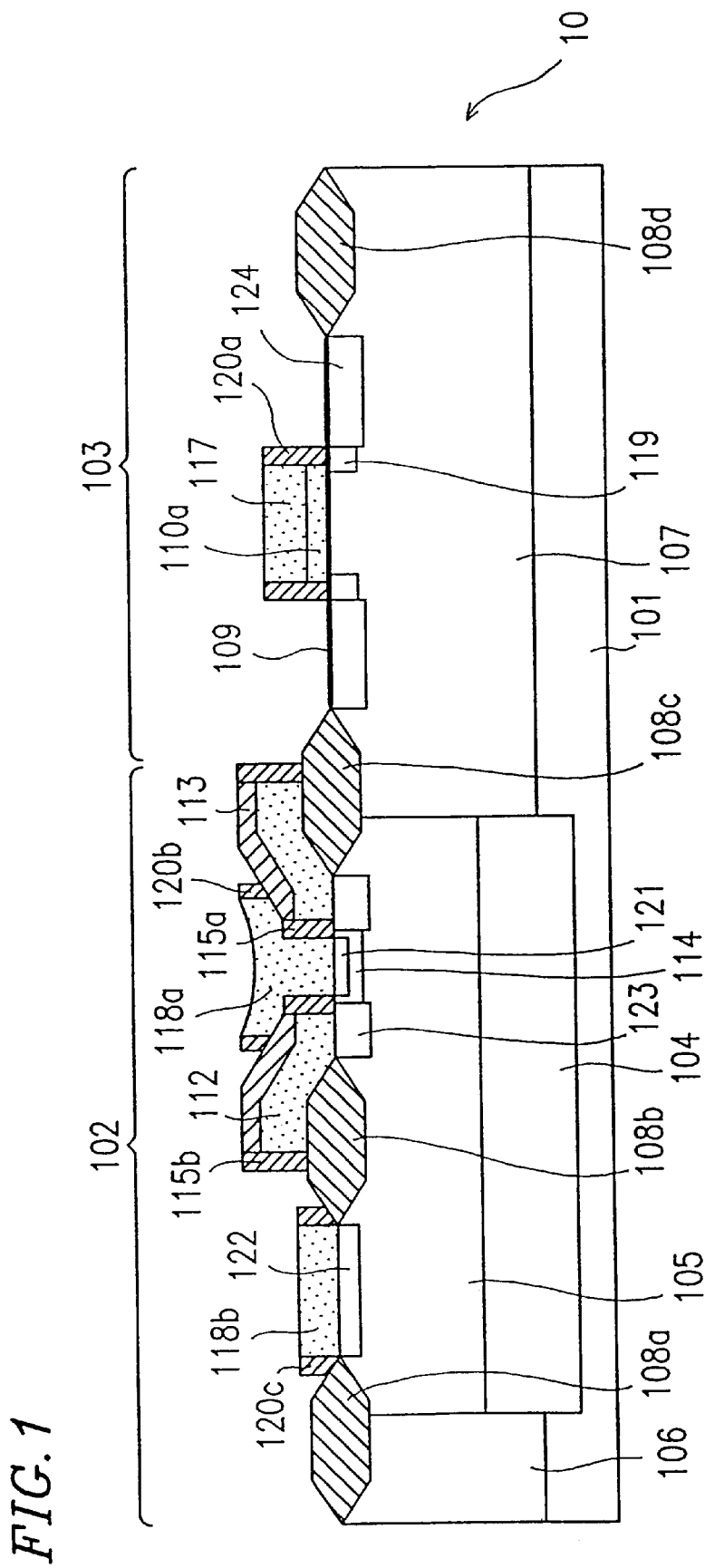
FIG. 1 is a cross-sectional view illustrating a structure of a Bi-CMOS IC device according to an example of the present invention.

FIG. 1 is a cross-sectional view illustrating a structure of the Bi-CMOS IC device according to an example of the present invention.

A substrate 10 illustrated in FIG. 1 includes a P-type silicon semiconductor substrate 101, a bipolar transistor region 102 and a MOS transistor region 103. An N-type buried collector layer 104 of the bipolar transistor is provided on the P-type semiconductor substrate 101. An N-type epitaxial layer (not shown) is provided on the entire surface of the P-type semiconductor substrate 101. An N-type collector layer 105 is formed in an upper portion of the N-type epitaxial layer. A P-type layer 106 of the bipolar transistor is formed in an upper portion of the N-type epitaxial layer. A P-type well layer 107 of an N-type MOS transistor is formed in an upper portion of the N-type epitaxial layer. LOCOS oxide films 108a to 108d are provided on the surface of the N-type epitaxial layer. A gate oxide film 109 is provided on the N-type epitaxial layer. A base lead electrode 112 of an NPN transistor is formed of a polycrystalline silicon film. An insulation film 113 is provided on the base lead electrode 112. An intrinsic base layer 114 is provided for the NPN transistor. Side wall insulation films 115a and 115b are provided on respective side surfaces of the base lead electrode 112. A gate electrode includes a lower polycrystalline silicon layer 110a and an upper polycrystalline silicon layer 117. The substrate 10 also includes a polycrystalline silicon emitter electrode 118a, a polycrystalline silicon collector electrode 118b and an LDD layer 119 of the N-type MOS transistor. The substrate 10 further includes an emitter layer 121, a collector contact layer 122, an external base layer 123, and a source-drain layer 124 of the N-type MOS transistor. A side wall 120a of the gate electrode 110a and 117, a side wall 120b of the emitter electrode 118a, and a side wall 120c of the collector electrode 118b are formed of an insulation film.

Referring to FIGS. 2 to 13, a method for producing the Bi-CMOS IC device illustrated in FIG. 1 (which includes the NPN bipolar transistor and the N-type MOS transistor integrated on the P-type semiconductor substrate 101) will now be described.

Figure 2:
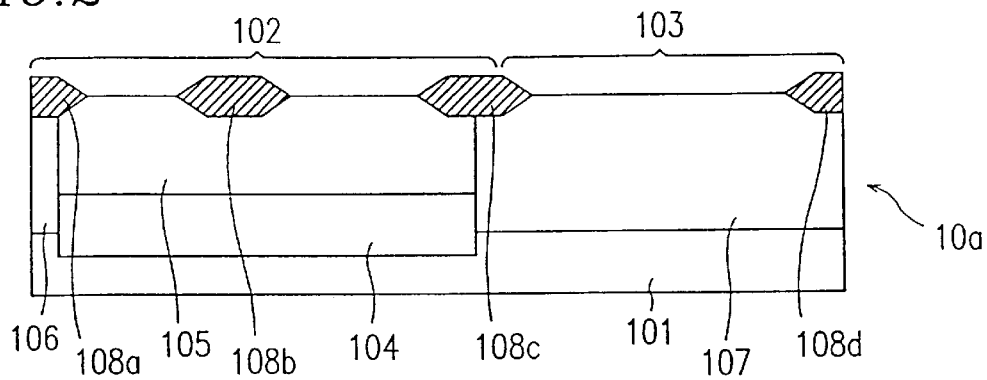
FIGS. 2 to 13 are cross-sectional views illustrating a process of producing the Bi-CMOS IC device illustrated in FIG. 1.

FIG. 2 illustrates a substrate 10a which includes the P-type silicon semiconductor substrate 101 having a specific resistance of about 10 $\Omega$·cm and a surface orientation of (100) into which a phosphorus impurity has been introduced. A resist is applied on the P-type semiconductor substrate 101 and patterned in a predetermined pattern via a suitable photolithography technique. Using the resist as a mask, about $1 \times 10^{15}$ cm$^{-2}$ of arsenic ions are implanted into the P-type semiconductor substrate 101 with an acceleration energy of about 40 KeV. Then, a plasma ashing is performed using an oxygen gas to remove the resist. Thereafter, heat treatment at about 1100° C. is performed for about 30 minutes, thereby forming the N-type buried collector layer 104 having a junction depth of about 1 $\mu$m and a sheet resistance of about 100 $\Omega$/sq.

Next, the N-type epitaxial layer (not shown) is grown at about 1050° C. on the P-type semiconductor substrate 101 so as to have a specific resistance of about 5 $\Omega$·cm and a thickness of about 1 pm, using a phosphorus or arsenic impurity. Then, a resist is applied on the N-type epitaxial layer and patterned in a predetermined pattern employing a suitable photolithography technique. Using the resist as a mask, about $3 \times 10^{12}$ cm$^{-2}$ of phosphorus ions are implanted with an acceleration energy of about 80 KeV. Then, the resist is removed by a plasma ashing process.

A resist is again applied on the N-type epitaxial layer and patterned in a predetermined pattern employing a suitable photolithography technique. Using the resist as a mask, about $2 \times 10^{13}$ cm$^{-2}$ of boron ions are implanted with an acceleration energy of about 30 KeV. Then, the resist is removed.

Thereafter, heat treatment at about 1100° C. is performed for about 1 hour in a nitrogen atmosphere. As a result, a diffusion layer reaching the N-type buried collector layer 104 has a depth of about 1.2 $\mu$m, thereby forming the N-type collector layer 105 having a surface concentration of about $5 \times 10^{16}$ cm$^{-3}$. Moreover, another diffusion layer reaching the P-type semiconductor substrate 101 has a depth of about 1.5 μm, thereby forming the P-type layer 106 and the P-type well layer 107 of the N-type MOS transistor having a surface concentration of about $5 \times 10^{17}$ cm$^{-3}$.

Although not shown in the figure, an N-type well layer of a P-type MOS transistor is also formed at the same time as the N-type collector layer 105 of the NPN bipolar transistor.

Next, the surface of the N-type epitaxial layer (not shown) is oxidized in an oxygen atmosphere, thereby growing a protective oxide film having a thickness of about 40 nm. Then, a silicon nitride film (not shown) having a thickness of about 120 nm is grown by a low pressure CVD method in a gas containing dichlorosilane and ammonium. Thereafter, a resist is applied on the surface of the silicon nitride film and patterned in a predetermined pattern employing a suitable photolithography technique. Using the resist as a mask, a dry etching process is performed using a gas containing from and oxygen to partially remove and thus pattern the silicon nitride film. Then, the resist is removed by a plasma ashing process.

Using the patterned silicon nitride film as a mask, the surface of the substrate 10a is oxidized by a pyrogenic method at about 1000° C., so as to form the device isolation LOCOS oxide films 108a to 108d each having a thickness of about 500 nm. After the device isolation LOCOS oxide films 108a to 108d have been formed, the silicon nitride film is removed by using a phosphoric acid solution, and the protective oxide film is removed by using a fluorinated acid solution.

Figure 14:
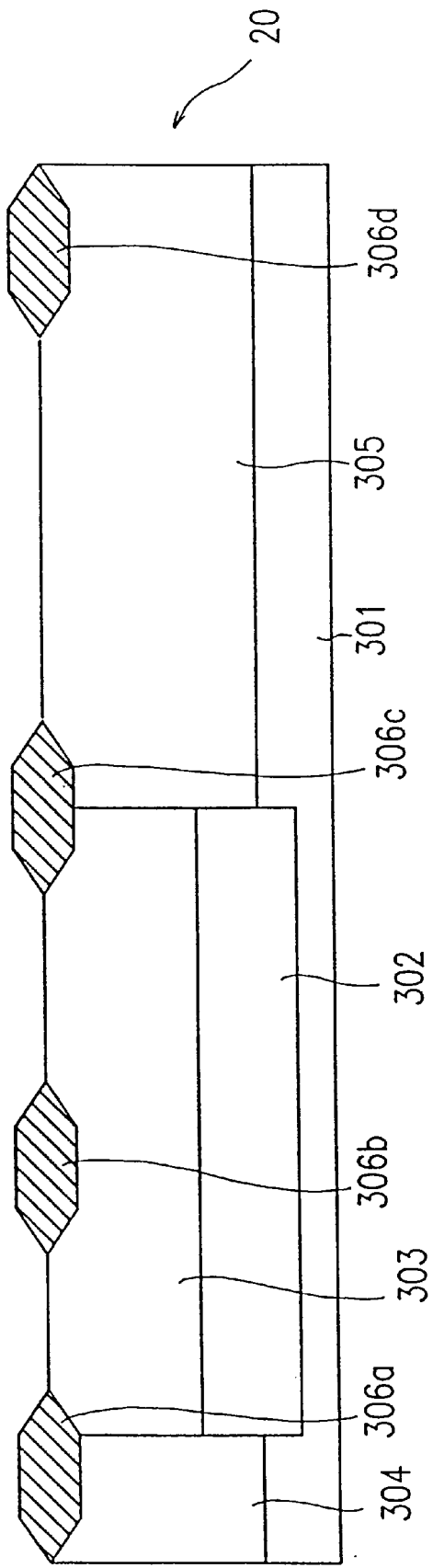
FIGS. 14 to 27 are cross-sectional views illustrating a process of producing a Bi-CMOS IC device.
Figure 15:
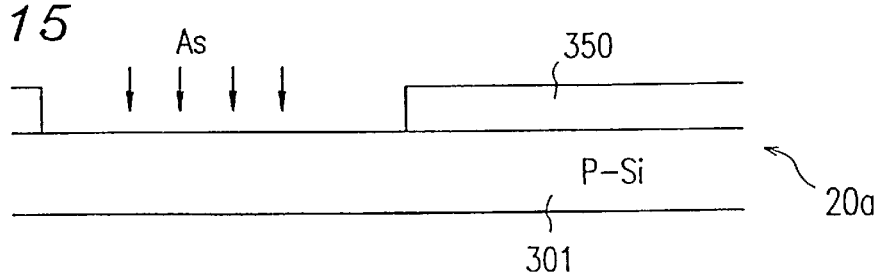
Figure 16:
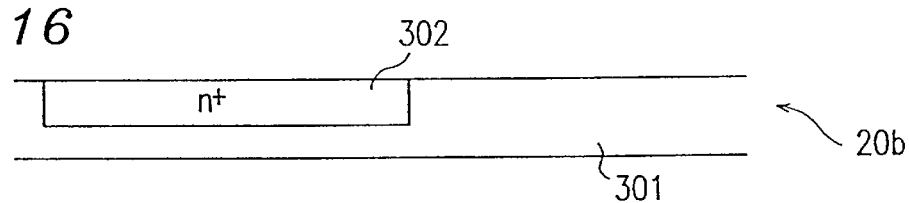
Figure 17:
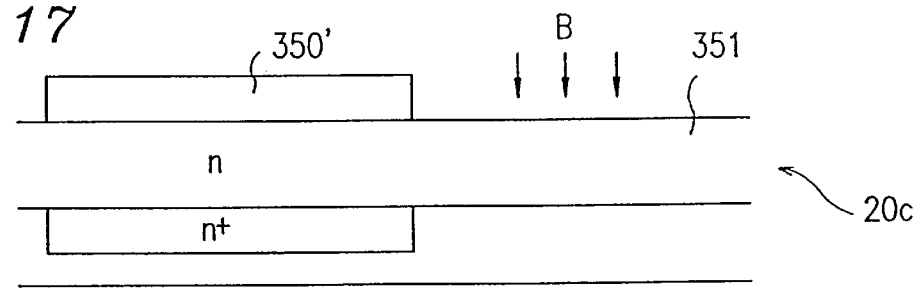
Figure 18:
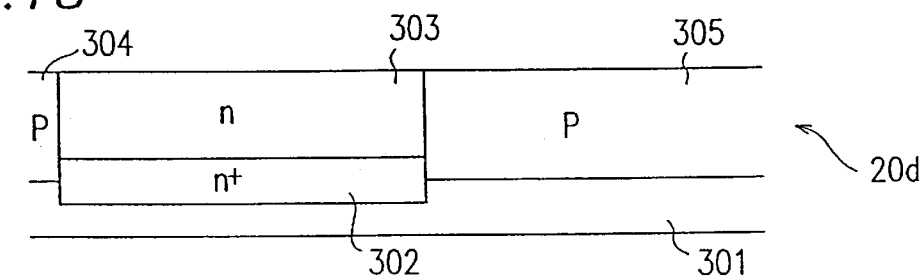
Figure 19:
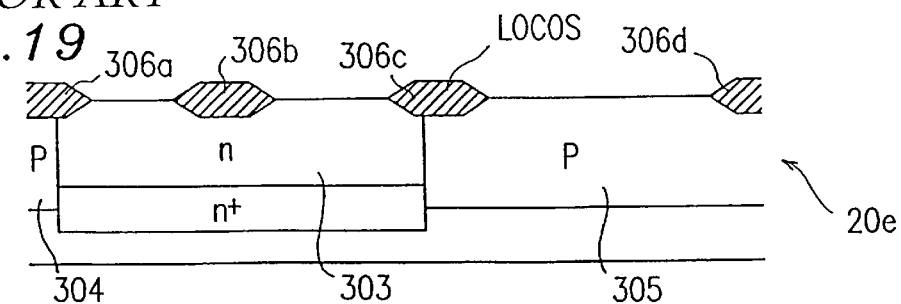
Figure 20:
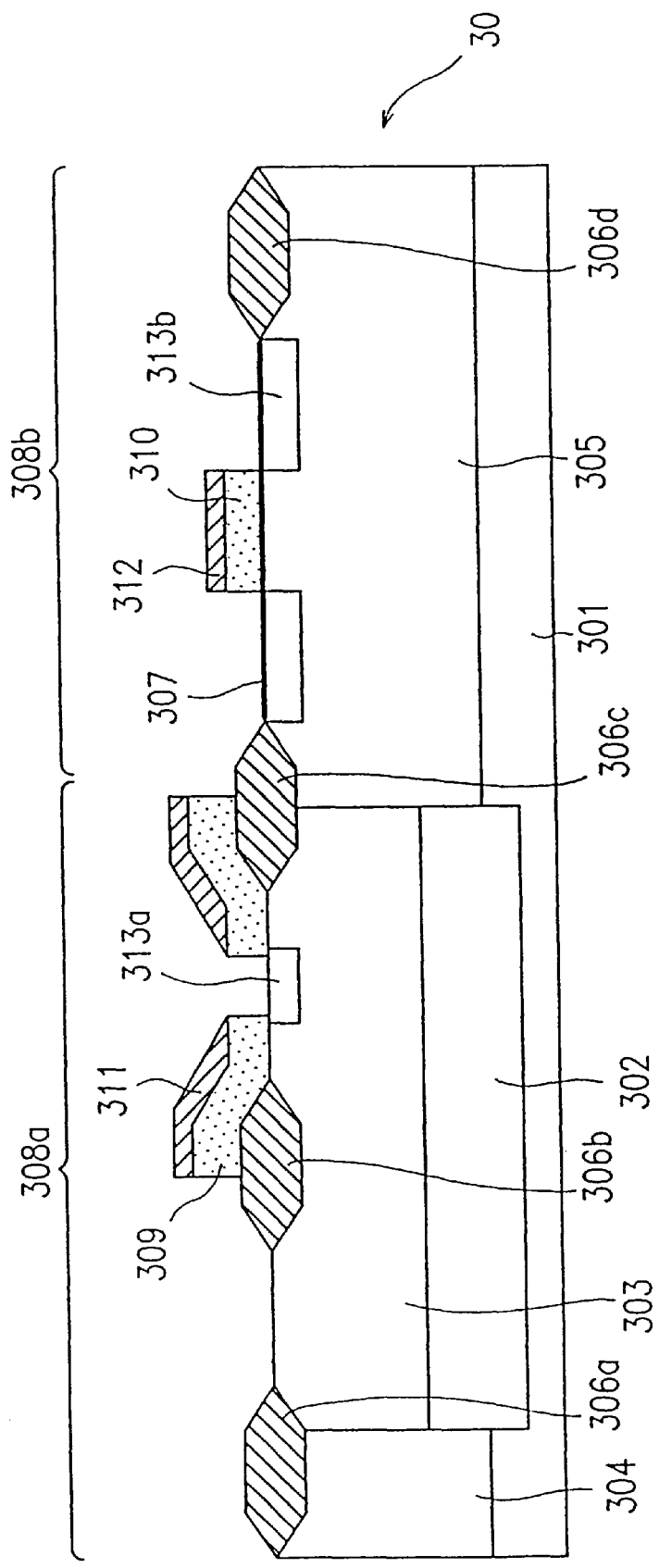
Figure 21:
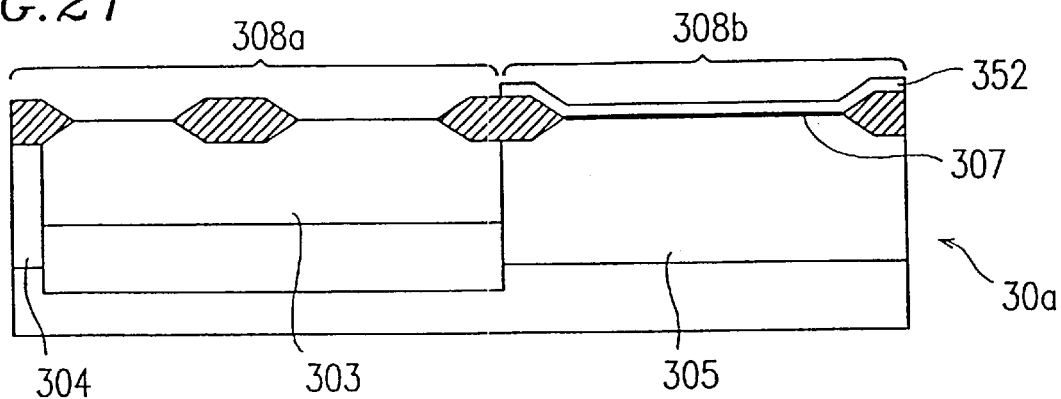
Figure 22:
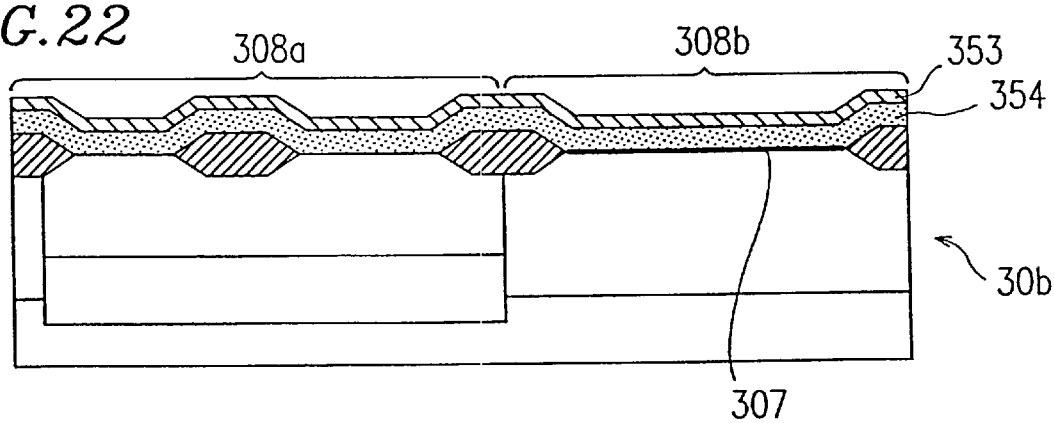
Figure 23:
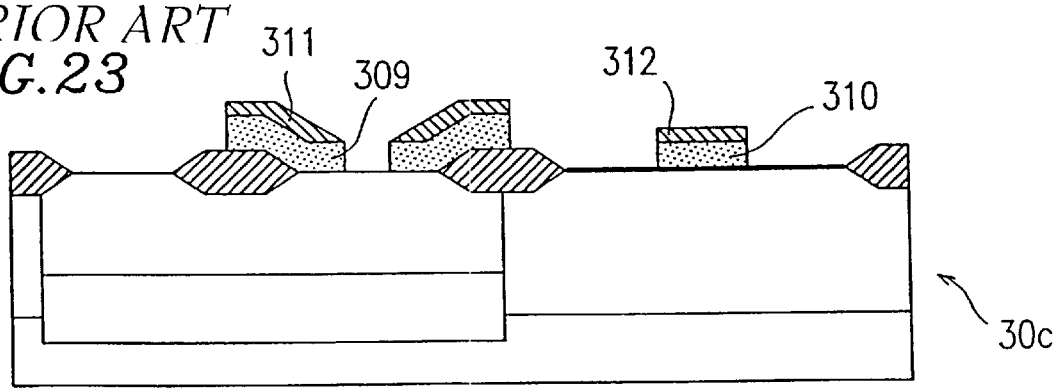
Figure 24:
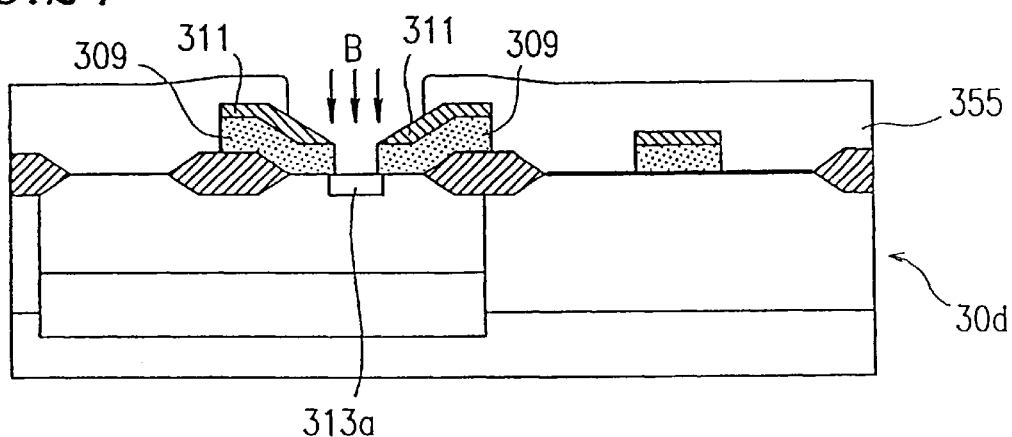
Figure 25:
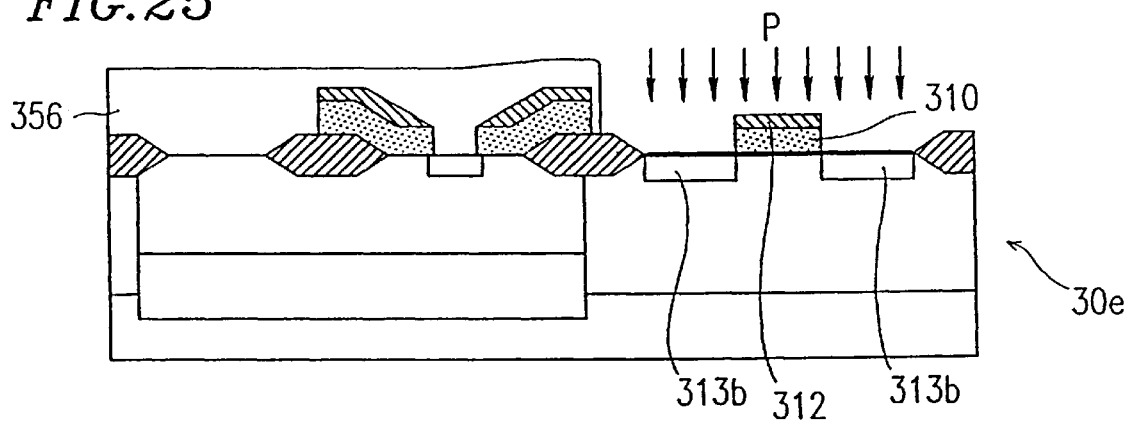
Figure 26:
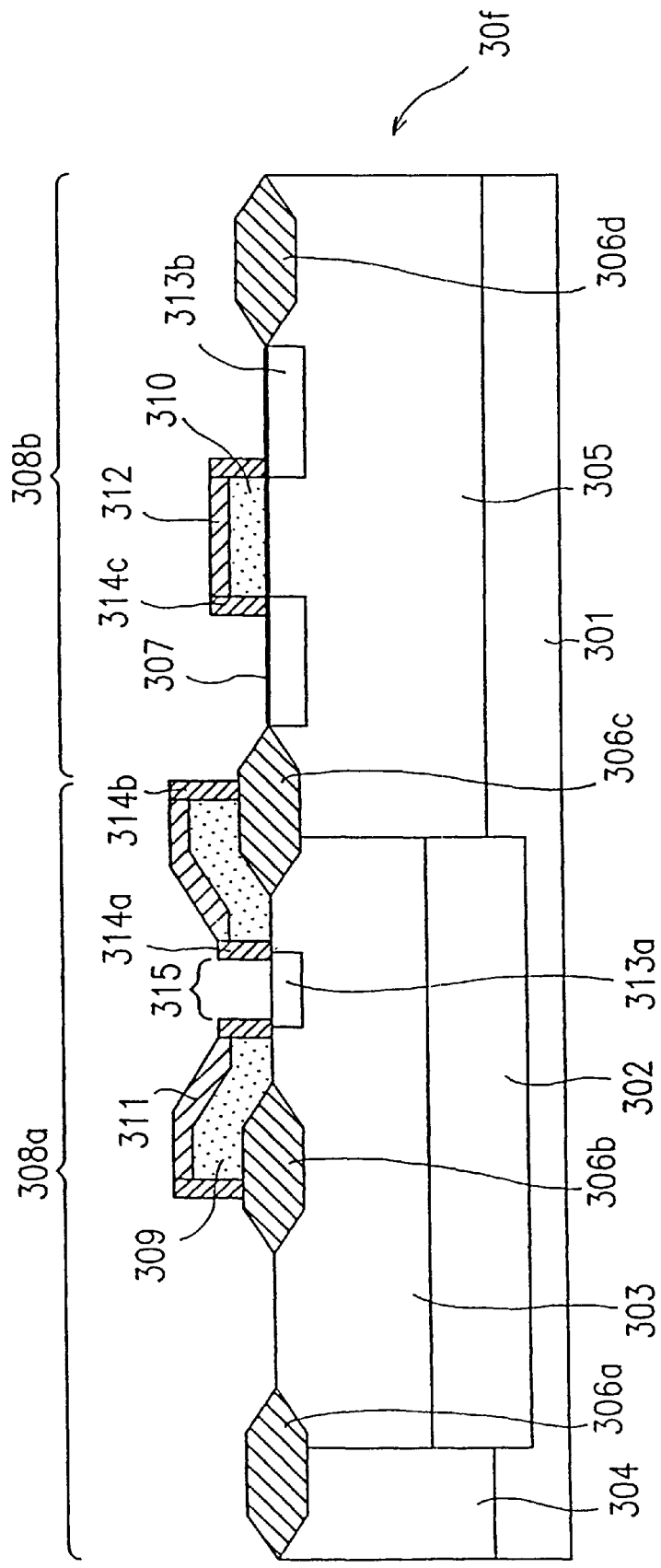
Figure 27:
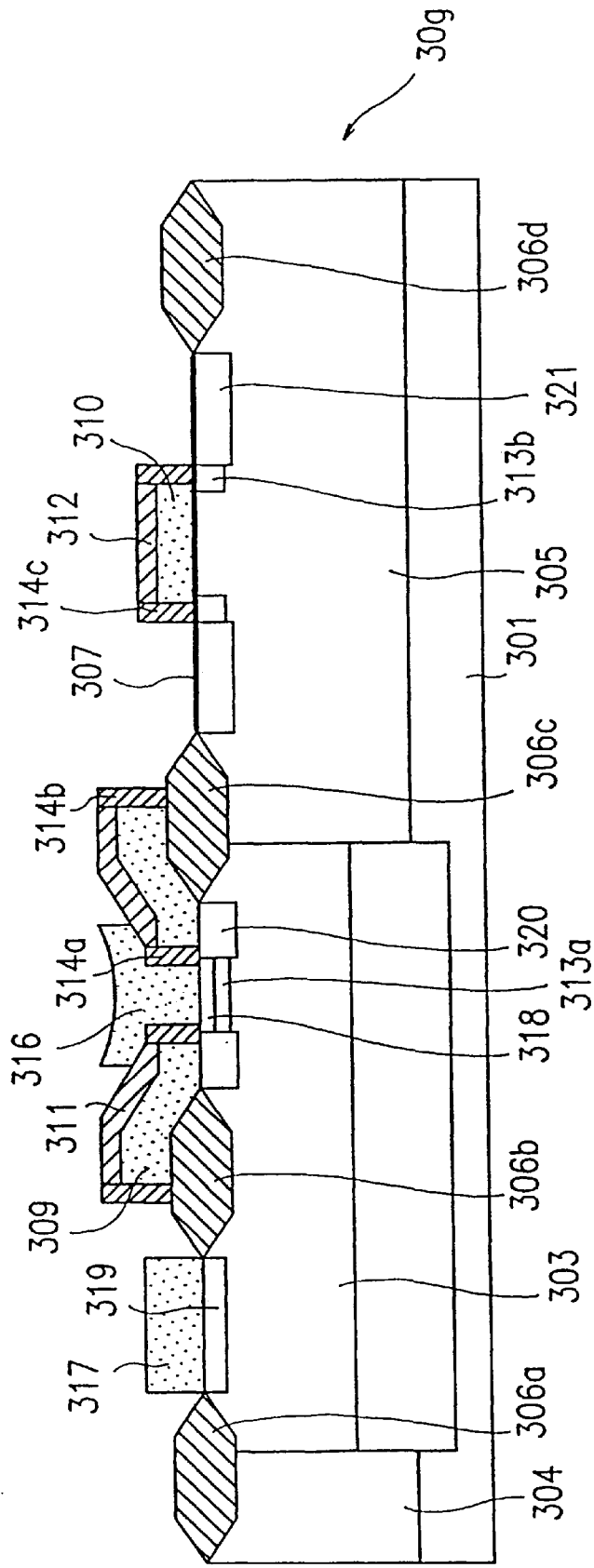

The method for forming the substrate 10a may be the same as the conventional method of forming the substrate 20 (FIG. 14).

Figure 3:
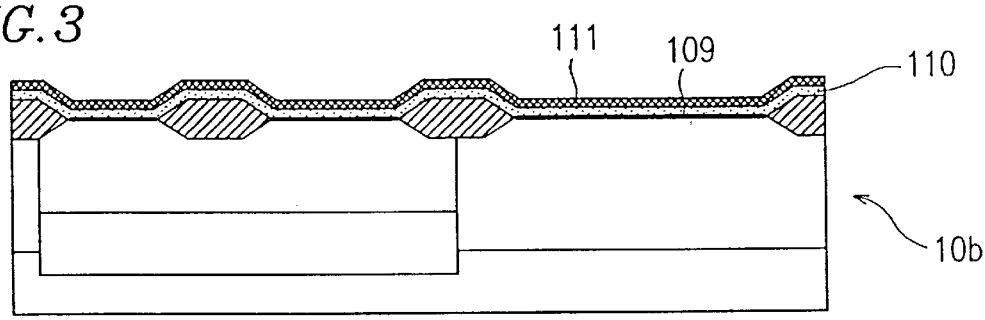

FIG. 3 illustrates a substrate 10b which includes a polycrystalline silicon film 110 (first conductive film) formed on the gate oxide film 109 which forms the lower gate electrode layer 110a, and a silicon nitride film 111 (first insulation film) formed on the polycrystalline silicon film 110.

Referring to FIG. 3, the gate oxide film 109 is formed by oxidizing the surface of the N-type epitaxial layer (not shown) at about 850° C. by a pyrogenic method. The thickness of the gate oxide film 109 is about 5 nm. Then, the polycrystalline silicon film 110 is grown on the gate oxide film 109 by a low pressure CVD method using a silane gas. The thickness of the polycrystalline silicon film 110 is about 100 nm.

The silicon nitride film 111 is grown by a low pressure CVD method using a gas containing dichlorosilane and ammonium. The thickness of the silicon nitride film 111 is about 40 nm.

Figure 4:
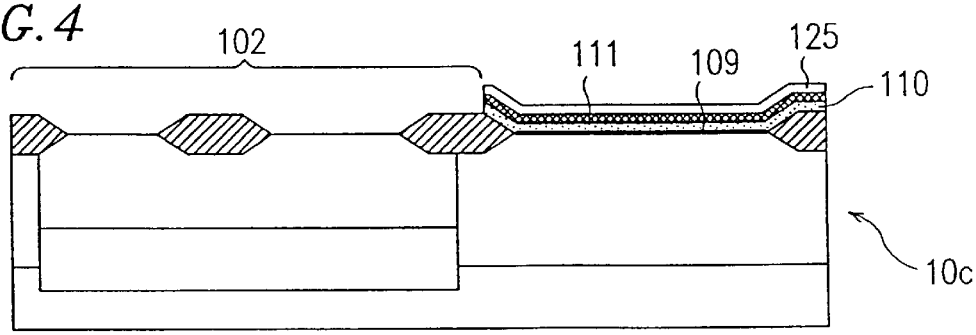

Referring to FIG. 4, a resist 125 is applied on the substrate 10b and patterned in a predetermined pattern employing a suitable photolithography technique so as to have a window corresponding to the bipolar transistor region 102, thereby covering only the MOS transistor region 103. Using the resist 125 as a mask, a dry etching process is performed using a gas containing from and oxygen to partially remove a portion of the silicon nitride film 111 corresponding to the bipolar transistor region 102. A portion of the polycrystalline silicon film 110 corresponding to the bipolar transistor region 102 is removed by a dry etching process using a mixed gas containing chlorine and hydrogen bromide. A portion of the gate oxide film 109 corresponding to the bipolar transistor region 102 is removed by a wet etching process using a fluorinated acid solution. Thus, a substrate 10c is obtained, as illustrated in FIG. 4. After these etching processes, the resist 125 covering the MOS transistor region 103 is removed by a plasma ashing process.

Figure 5:
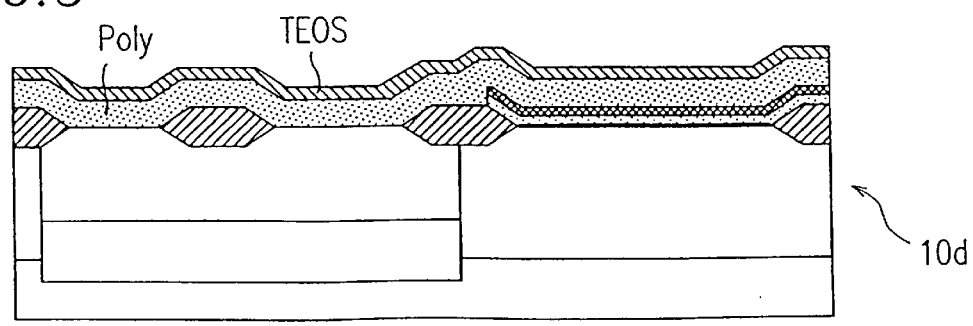

FIG. 5 illustrates a substrate 10d in which a polycrystalline silicon film Poly and a TEOS (Tetraethoxysilane) film TEOS have been formed on the substrate 10c.

The polycrystalline silicon film Poly having a thickness of about 200 nm is grown on the entire surface of the substrate 10c by a low pressure CVD method using a silane gas. Then, in order to introduce a P-type impurity, about $3 \times 10^{15}$ cm$^{-2}$ of boron ions are implanted into a predetermined region (where the transistor is to be formed) with an acceleration energy of about 10 KeV. Thereafter, the TEOS film TEOS having a thickness of about 100 nm is grown on the polycrystalline silicon film Poly by a low pressure CVD method using a mixed gas containing TEOS and oxygen.

Figure 6:
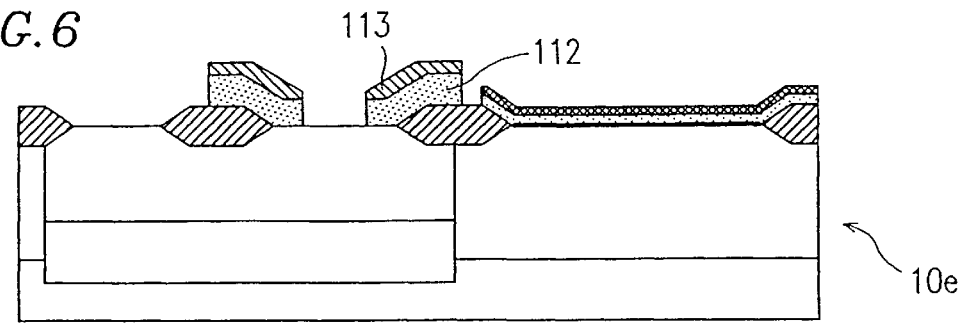

FIG. 6 illustrates a substrate 10e in which the polycrystalline silicon film Poly and the TEOS film TEOS have been partially removed, thereby forming the base lead electrode 112 and the insulation film 113.

First, a resist (not shown) is applied on the TEOS film TEOS and patterned in a predetermined pattern employing a suitable photolithography technique. Using the resist as a mask, a dry etching process is performed using a methyl fluoride gas so as to partially remove the TEOS film TEOS. Then, using the same resist, the polycrystalline silicon film Poly is partially removed by another etching process using a mixed gas containing chlorine, hydrogen bromide and oxygen. Thus, the base lead electrode 112 and the insulation film 113 are formed. At this point, the base lead electrode 112 has a sheet resistance of about 200 Ω/sq because it has been implanted with boron ions.

Figure 7:
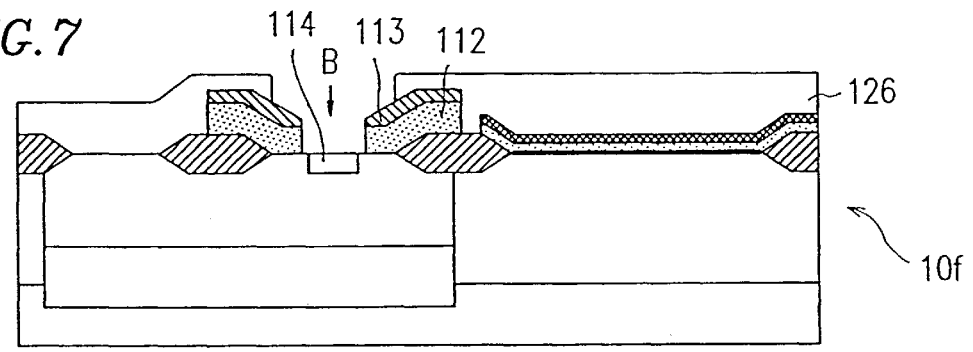

Referring to FIG. 7, a resist 126 is applied on the substrate 10e illustrated in FIG. 6 and patterned in a predetermined pattern employing a suitable photolithography technique. Using the resist 126, the base lead electrode 112 and the insulation film 113 as masks, about $1 \times 10^{13}$ cm$^{-2}$ of boron ions are implanted with an acceleration energy of about 10 KeV so as to form the intrinsic base layer 114. After introducing the impurity into the intrinsic base layer 114, the resist 126 is removed. Thereafter, a substrate 10f is subjected to heat treatment so that the intrinsic base layer 114 has a diffusion depth of about 0.2 μm and a surface concentration of about $1 \times 10^{18}$ cm$^{-3}$.

Figure 8:
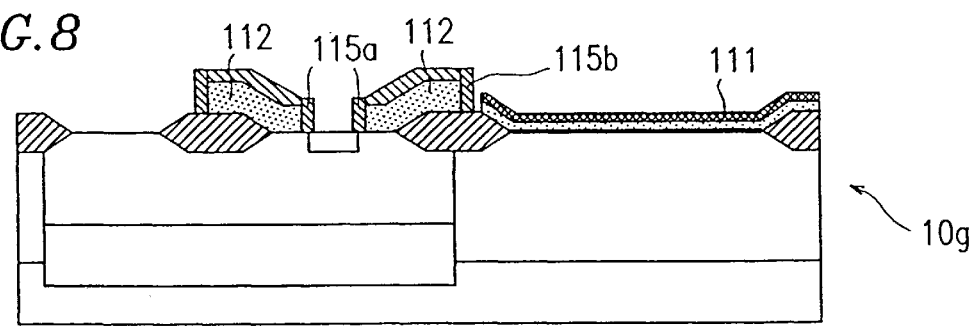

FIG. 8 illustrates a substrate 10g in which the side walls 115a and 115b have been formed on side surfaces of the base lead electrode 112.

First, another TEOS film having a thickness of about 200 nm is grown by a low pressure CVD method using a mixed gas containing TEOS and oxygen. Then, a dry etching process is performed using a mixed gas containing methyl fluoride and oxygen so as to partially remove the TEOS film, thereby forming the side walls 115a and 115b each having a thickness of about 150 nm on the side surfaces of the base lead electrode 112.

Figure 9:
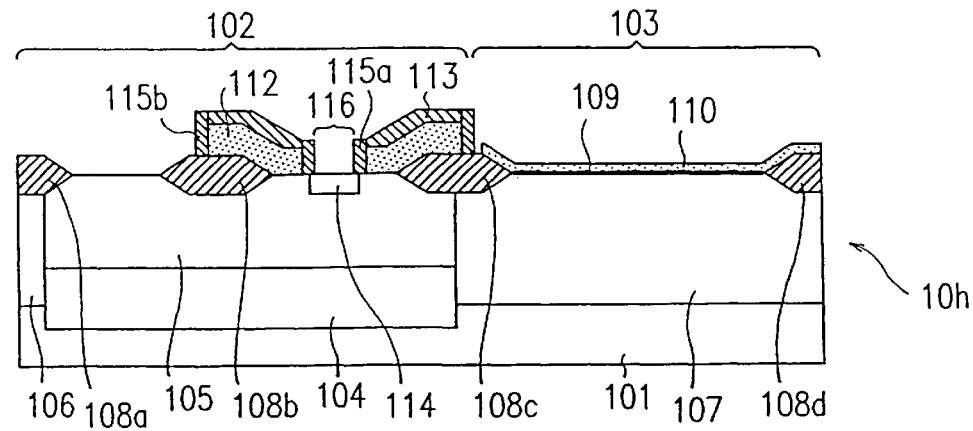

FIG. 9 illustrates a substrate 10h in which the rest of the silicon nitride film 111 corresponding to the MOS transistor region 103 has been removed from the substrate 10g illustrated in FIG. 8. The silicon nitride film 111 is removed by using a phosphoric acid solution. Reference numeral 116 in FIG. 9 denotes an emitter electrode extraction opening which is surrounded by the side walls 115a over a region where the intrinsic base layer 114 is formed.

Figure 10:
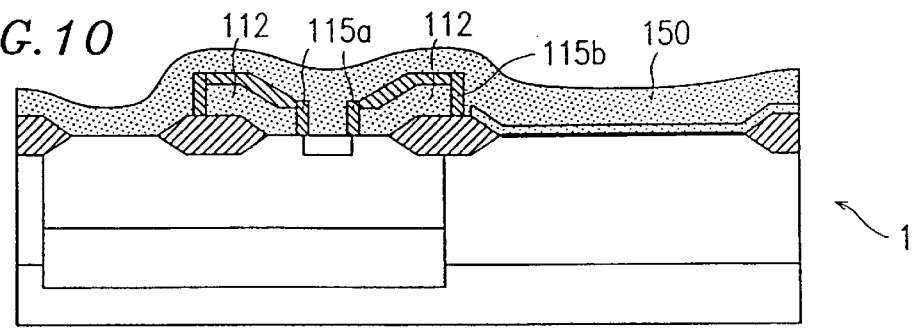

FIG. 10 illustrates a substrate 10i in which a polycrystalline silicon film 150 has been formed on the substrate 10h illustrated in FIG. 9. After the silicon nitride film 111 is removed, the polycrystalline silicon film 150 is formed to have a thickness of about 150 nm on the entire surface of the substrate 10h by a low pressure CVD method using a silane gas. Thereafter, about 5×10$^{15}$ cm$^{-2}$ of arsenic ions are implanted into the polycrystalline silicon film 150 with an acceleration energy of about 30 KeV so as to introduce an N-type impurity.

In the N-type impurity implantation process, when a thickness of the polycrystalline silicon film 150 is as small as about the grain size, even if the acceleration energy for the ion implantation is reduced, the impurity ions will channel through the grain boundary of the polycrystalline silicon film 150 and thereby reach a region under the gate electrode 110a which is to be a channel region of the MOS transistor, thus deteriorating the MOS transistor characteristics.

Moreover, in view of the mass productivity, the implantation energy cannot be excessively reduced. For example, in order to form the illustrated gate electrode 117, an energy of at least about 20 KeV is required for the arsenic ion implantation.

According to the present example, however, the lower polycrystalline silicon film (the lower gate electrode layer 110a) is underlying the upper polycrystalline silicon film 150 having a thickness of about 150 nm. Therefore, the total thickness of the polycrystalline silicon film is about 250 nm, thereby preventing the arsenic impurity used in the ion implantation from reaching the region under the gate electrode 110a which is to be the channel region of the MOS transistor.

Figure 11:
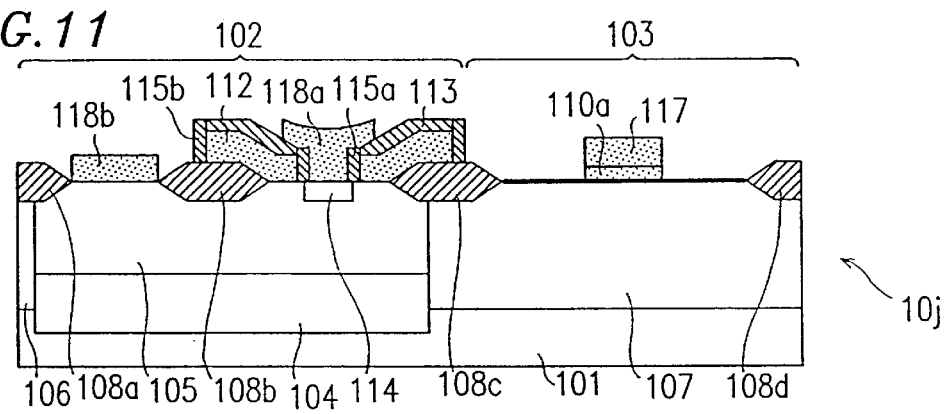

FIG. 11 illustrates a substrate 10j in which the polycrystalline silicon film 150 and the polycrystalline silicon film 110a have been partially etched away. First, a resist is applied on the polycrystalline silicon film 150 and patterned in a predetermined pattern employing a suitable photolithography technique. Then, using the resist as a mask, the N-doped polycrystalline silicon films 150 and 110a are partially removed by an etching process using a mixed gas containing chlorine, hydrogen bromide and oxygen, thereby forming the lower gate electrode layer 110a, the upper gate electrode layer 117, the emitter electrode 118a and the collector electrode 118b. Thus, the gate electrode 117 and 110a of the MOS transistor, and the emitter electrode 118a and the collector electrode 118b of the bipolar transistor are formed at the same time. Then, the resist is removed by a plasma ashing process.

At this point, the gate electrode 117 and 110a, the emitter electrode 118a and the collector electrode 118b each have a sheet resistance of about 200 Ω/sq because of the arsenic ion implantation. The total thickness of the gate electrode 117 and 110a is about 250 nm. The thickness of the emitter electrode 118a is about 150 nm, and the thickness of the collector electrode 118b is also about 150 nm.

Figure 12:
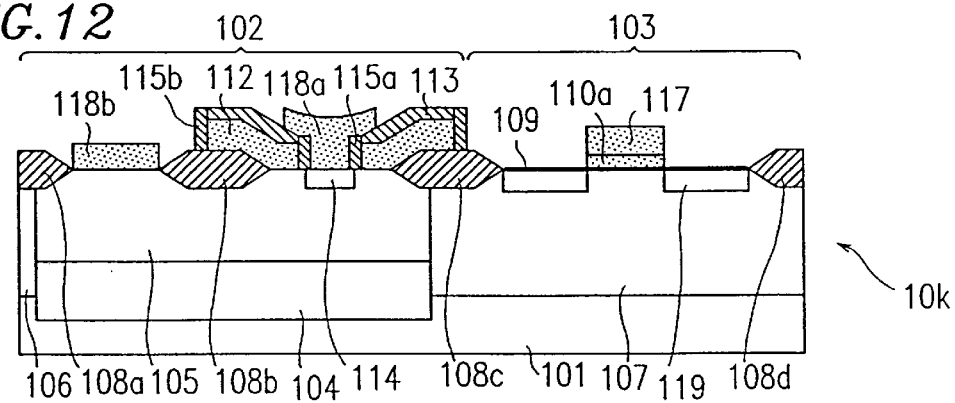

FIG. 12 illustrates a substrate 10k in which the LDD layer 119 has been formed. First, a resist is applied on the substrate 10j illustrated in FIG. 11 and patterned in a predetermined pattern employing a suitable photolithography technique. Using the resist and the gate electrode 117 as masks, about 1×10$^{13}$ cm$^{-2}$ of phosphorus ions are implanted with an acceleration energy of about 20 KeV, thereby forming the LDD layer 119 of the N-type MOS transistor. Then, the resist is removed by a plasma ashing process. The junction depth of the LDD layer 119 is about 0.15 μm, and the surface concentration thereof is about 1×10$^{18}$ cm$^{-3}$.

Also in the ion implantation into the LDD layer 119, when the polycrystalline silicon film is very thin, the impurity ions pass through the gate electrode 110a as a mask and reach the region which is to be the channel region of the MOS transistor, thus deteriorating the MOS transistor characteristics. According to the present example, however, the lower polycrystalline silicon film (the lower gate electrode layer 110a) is underlying the upper polycrystalline silicon film 150 having a thickness of about 150 nm. Therefore, the total thickness of the polycrystalline silicon film is about 250 nm, thereby preventing the arsenic impurities used in the ion implantation from reaching the region under the gate electrode 110a which is to be the channel region of the MOS transistor.

Figure 13:
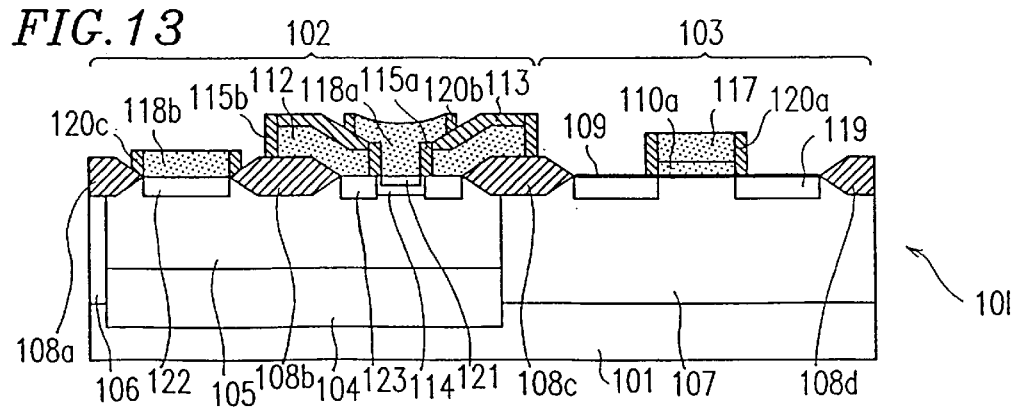

FIG. 13 illustrates a substrate 101 in which the side wall 120a (having a thickness of about 120 nm on each side surface of the gate electrode 117), the side wall 120b (on each side surface of the emitter electrode 118a of the bipolar transistor) and the side wall 120c (on each side surface of the collector electrode 118b of the bipolar transistor) have been formed. The side walls 120a, 120b and 120c are formed at the same time. First, a TEOS film having a thickness of about 150 nm is grown on the substrate 10k illustrated in FIG. 12 by a low pressure CVD method using a mixed gas containing TEOS and oxygen. Then, a dry etching process is performed using a mixed gas containing methyl fluoride and oxygen so as to partially remove the TEOS film, thereby forming the side walls 120a, 120b and 120c at the same time.

Then, the substrate 101 illustrated in FIG. 13 is subjected to heat treatment at about 900° C. for about 30 minutes. Thus, the arsenic impurity in the polycrystalline silicon emitter electrode 118a and the polycrystalline silicon collector electrode 118b and the boron impurity in the polycrystalline silicon base lead electrode 112 are introduced into the epitaxial layer, thereby forming the emitter layer 121, the collector contact layer 122 and the external base layer 123. At this point, the emitter layer 121 and the collector contact layer 122 each have a junction depth of about 0.05 μm and a surface concentration of about 3×10$^{20}$ cm$^{-3}$, and the external base layer 123 has a junction depth of about 0.2 μm and a surface concentration of about 1×10$^{20}$ cm$^{-3}$.

A resist is applied on the substrate 101 illustrated in FIG. 13 and patterned in a predetermined pattern employing a suitable photolithography technique. Using the resist and the side walls 120a on the gate electrode 117 as masks, about 5×10$^{15}$ cm$^{-2}$ of arsenic ions are implanted with an acceleration energy of about 40 KeV. Again, since the lower gate electrode layer 110a is underlying the upper gate electrode layer 117, the impurity ions are prevented from reaching the channel region under the lower gate electrode layer 110a.

After the resist is removed by a plasma ashing process, the substrate 101 is subjected to heat treatment at about 850° C. in a nitrogen atmosphere for about 30 minutes. At this point, the source-drain layer 124 has a junction depth of about 0.15 μm and a surface concentration of about 1×10$^{20}$ cm$^{-3}$.

As can be seen from the above description, in the bipolar transistor, the external base layer 123 is extracted by the base lead electrode 112 formed of a polycrystalline silicon film. The emitter electrode extraction opening 116 (FIG. 9) of the emitter electrode 118a and the emitter layer 121 are formed in a self-alignment manner with respect to the base lead electrode 112 and the external base layer 123 by the use of the side walls 115a each having a thickness of about 150 nm. Therefore, according to the present invention, a semiconductor device is produced with a reduced parasitic component (e.g., a collector-base junction capacitance and a base resistance) of a bipolar transistor, thereby considerably increasing the high frequency characteristics.

In the MOS transistor, on the other hand, the source-drain layer 124 is formed in a self-alignment manner with respect to the gate electrode 117 and the LDD layer 119 by the use of the side walls 120a each having a thickness of about 120 nm. Thus, the hot carrier resistance is improved while maintaining the MOS transistor performance. Moreover, the gate electrode is formed in a layered structure including the lower gate electrode layer 110a and the upper gate electrode layer 117 (which is formed of the polycrystalline silicon film of which the emitter electrode 118a is also formed). The lower gate electrode layer 110a is formed by growing a polycrystalline silicon film on the gate oxide film 109 successively after the gate oxide film 109 is formed. Therefore, there is no contamination from the resist film, and the gate oxide film 109 can be as thin as about 5 nm without deteriorating the reliability of the device. Moreover, it is possible to prevent a decrease in the breakdown voltage or an increase in the amount of leak current of the gate oxide film 109 over time. Thus, the operating life of the transistor at about 100° C. can be as long as several tens of years.

Furthermore, the upper gate electrode layer 117 and the emitter electrode 118a are formed of the same polycrystalline silicon film. As a result, the total thickness of the gate electrode 110a and 117 (about 250 nm) can be sufficiently greater than the thickness of the emitter electrode 118a (about 150 nm) to prevent an impurity from reaching the channel region under the lower gate electrode layer 110a and thereby deteriorating the transistor characteristics (e.g., when introducing an impurity into the gate electrode, or during an ion implantation process for forming the LDD layer or the source-drain layer). The thickness of the emitter electrode 118a can be as small as about 150 nm, thereby reducing the emitter resistance which may deteriorate the high frequency characteristics.

As described above, in the Bi-CMOS IC device of the present invention, the gate electrode is formed in a structure including the upper gate electrode layer and the lower gate electrode layer. The upper layer is formed of a conductive film of which the emitter electrode is also formed. The lower layer is formed by growing a conductive film on the gate insulation film successively after the gate insulation film is formed. Thus, no photolithography process is performed after the gate insulation film is formed and before the gate electrode is formed thereon. Therefore, an MOS transistor and a bipolar transistor having good high frequency characteristics can be provided on the same semiconductor substrate without deteriorating the reliability of the gate insulation film of the MOS transistor. Moreover, the emitter electrode of the bipolar transistor is formed in a self-alignment manner with respect to the base lead electrode by the use of the side walls. Thus, it is possible to reduce the collector-base junction capacitance, etc., and to improve the high frequency characteristics.

In the method for producing the Bi-CMOS IC device according to the present invention, the emitter electrode opening and the emitter layer can be formed in a self-alignment manner with respect to the base lead electrode, and the source-drain layer can be formed in a self-alignment manner with respect to the gate electrode and the LDD layer. Moreover, the polycrystalline silicon film to be the gate electrode can be formed successively after the gate insulation film is formed. Thus, a first conductive film to be the lower gate electrode layer and a first insulation film can be formed immediately after the gate insulation film is formed on the semiconductor substrate. Then, the first insulation film, the first conductive film and the gate insulation film are removed from the bipolar transistor region. As a result, no photolithography process is performed after the gate insulation film is formed and before the gate electrode is formed thereon, thereby avoiding a resist film being formed directly on the gate insulation film. Thus, it is possible to obtain an IC device including an MOS transistor, which has a highly-reliable gate insulation film and a high hot carrier resistance, and a bipolar transistor, which has good high frequency characteristics.

Moreover, a third conductive film and a portion of the first conductive film outside the bipolar transistor region are selectively etched away, thereby forming an emitter electrode over the emitter electrode extraction opening and the gate electrode of the MOS transistor (including the upper layer of the third conductive film and the lower layer of the first conductive film). Therefore, the total thickness of the layered gate electrode can be sufficiently large to prevent an impurity from reaching the channel region under the lower gate electrode layer and thereby deteriorating the transistor characteristics (e.g., when introducing an impurity into the gate electrode, or during an ion implantation process for forming the LDD layer or the source-drain layer). The thickness of the emitter electrode of the bipolar transistor can be sufficiently small to reduce the emitter resistance which may deteriorate the high frequency characteristics.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a bipolar transistor and an MOS transistor, comprising the steps of:

forming a gate insulation film in an MOS transistor region where the MOS transistor is to be formed and in a bipolar transistor region where the bipolar transistor is to be formed;

forming a first conductive film and a first insulation film on the gate insulation film;

removing the first insulation film, the first conductive film and the gate insulation film from the bipolar transistor region;

removing the first insulation film from the MOS transistor region;

forming a second conductive film on the first conductive film in a region where the first insulation film is removed; and performing an impurity ion implantation process whereby impurities are prevented from reaching the MOS transistor region through the second conductive film.

2. A method according to claim 1, further comprising the steps of:

forming the second conductive film in a region where an emitter electrode of the bipolar transistor is to be formed; and performing an etching process so as to form the emitter electrode from the second conductive film and a gate electrode from the first and second conductive films.

3. A method according to claim 1, wherein the step of removing the first insulation film, the first conductive film and gate insulation film further comprises the steps of:

performing an etching process so as to remove the first insulation film and the first conductive film; and performing an etching process so as to remove the gate insulation film.

4. A method for producing a Bi-CMOS IC device, comprising the steps of:

successively forming a gate insulation film, a first conductive film and a first insulation film on a semiconductor substrate including an MOS transistor region where an MOS transistor is to be formed and a bipolar transistor region where a bipolar transistor is to be formed;

removing the first insulation film, the first conductive film and the gate insulation film from the bipolar transistor region;

successively growing a second conductive film and a second insulation film over the semiconductor substrate;

selectively etching the second insulation film and the second conductive film so as to form a base lead electrode and an insulation film on the base lead electrode;

growing a third insulation film on an entire surface of the semiconductor substrate including an emitter region where an emitter is to be formed, the emitter region being surrounded by a side surface of the base lead electrode and the base lead electrode;

anisotropically etching the third insulation film so as to leave a side wall on each side surface of the base lead electrode in the emitter region;

removing the first insulation film;

growing a third conductive film on the entire surface of the semiconductor substrate including an emitter electrode extraction opening defined by the side walls in the emitter region; and selectively etching the third conductive film and the first conductive film outside the bipolar transistor region so as to form an emitter electrode over the emitter electrode extraction opening and a gate electrode of the MOS transistor, the gate electrode including the third conductive film as an upper layer and the first conductive film as a lower layer.

* * * * *